United States Patent [19]

Seo

[11] Patent Number: 6,069,830
[45] Date of Patent: May 30, 2000

[54] CIRCUIT AND METHOD FOR SENSING MEMORY CELL HAVING MULTIPLE THRESHOLD VOLTAGES

[75] Inventor: Seok-Ho Seo, Choongcheongbuk-Do, Rep. of Korea

[73] Assignee: LG Semicon Co., Ltd., Cheongju, Rep. of Korea

[21] Appl. No.: 09/146,664

[22] Filed: Sep. 3, 1998

[30] Foreign Application Priority Data

Jan. 17, 1998 [KR] Rep. of Korea ......................... 98-1339

[51] Int. Cl.[7] ........................................ G11C 7/02
[52] U.S. Cl. ...................... 365/207; 365/185.21; 365/236
[58] Field of Search ............... 365/207, 185.03, 365/185.21, 168, 236, 185.01, 206, 164

[56] References Cited

U.S. PATENT DOCUMENTS 5,163,021  11/1992  Mehrptra et al. ........................ 365/185
5,258,669  11/1993  Nakashima ............................... 307/530
5,422,842   6/1995  Cernea et al. ........................... 365/185
5,508,958   4/1996  Fazio et al. ......................... 365/185.19

*Primary Examiner*—David Nelms
*Assistant Examiner*—Hoai V. Ho
*Attorney, Agent, or Firm*—Fleshner & Kim, LLP

[57] ABSTRACT

A circuit and method for sensing a memory cell having a plurality of threshold voltages is provided that implements a low power and voltage sensing operation and reduces a multiple level memory cell size by reducing the size of the circuit. The circuit includes a switch for applying or blocking a current to/from a selected memory cell in accordance with a switching control signal inputted into a bit line coupled with the selected memory cell. A current comparison unit compares sizes of a current flowing on the bit line and one reference current to output a result of the comparison. A memory stores the result of the comparison performed by the current comparison unit, and a counter register circuit is provided that has a range corresponding to the number of multiple levels of the memory cell and counts a value that corresponds to stored data in the selected cell.

18 Claims, 5 Drawing Sheets

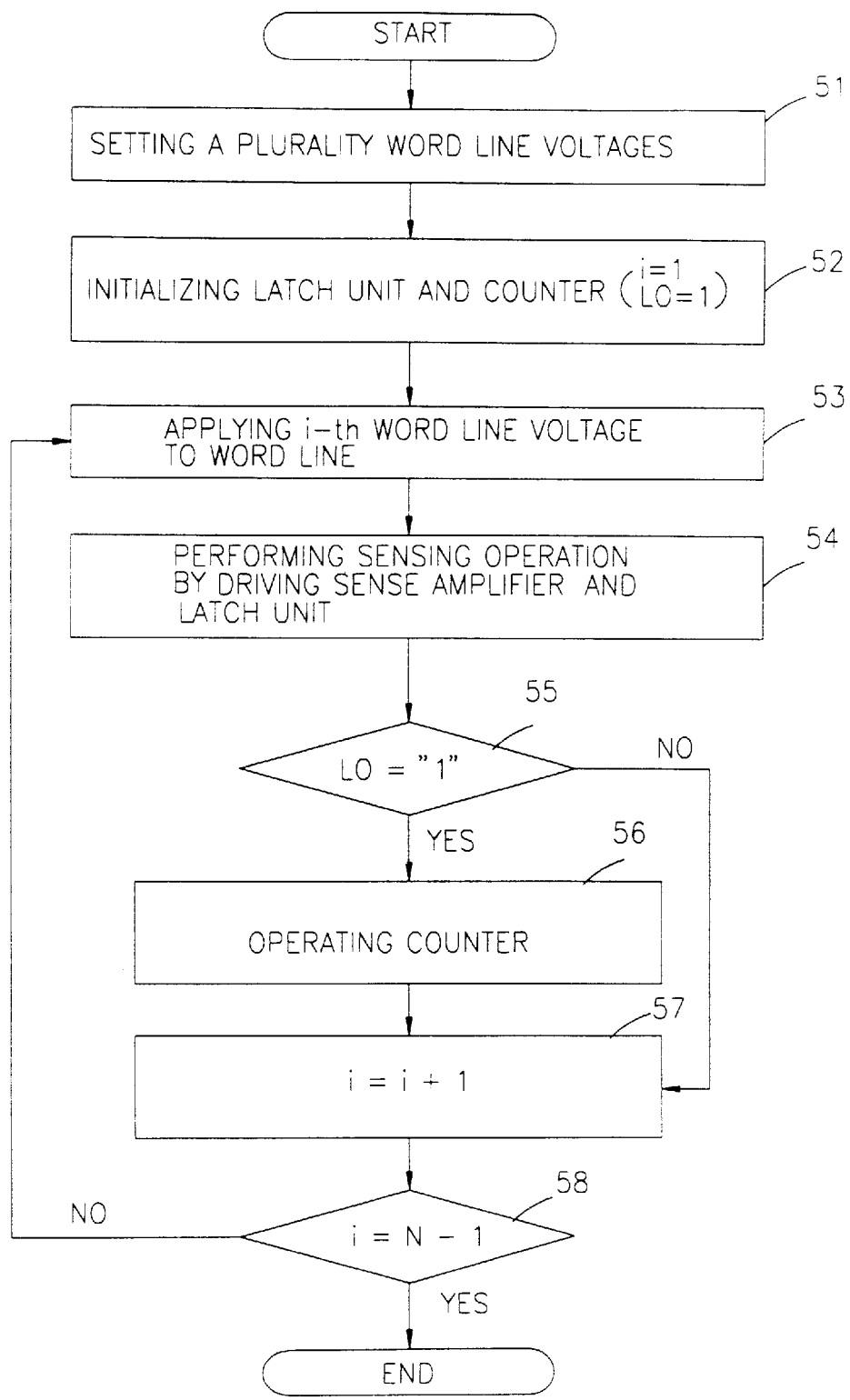

CIRCUIT AND METHOD FOR SENSING MEMORY CELL HAVING MULTIPLE THRESHOLD VOLTAGES

BACKGROUND OF THE INVENTION

1. Field of the Invention

The present invention relates to a circuit and method for sensing a memory cell, and in particular, to a circuit and method for sensing a memory cell having a plurality of threshold voltages.

2. Background of the Related Art

As shown in FIG. 1, a related art sensing circuit for reading a multiple level cell includes a PMOS load transistor PM11, which has a source receiving a power voltage VCC and a gate and a drain connected together. An NMOS transistor NM11 has a drain connected with the drain of the PMOS load transistor PM11. An output signal from the drain of the NMOS transistor NM11 is inverted and is connected with its gate to configure a bit line regulation circuit 1. A bit line selection circuit 2 connects a predetermined cell with the bit line. PMOS transistors PM12 through PM14 have sources that respectively receive the power voltage VCC and gates respectively connected together and with the gate of the PMOS load transistor PM11.

NMOS transistors NM12 through NM14 have sources that are respectively connected with the drains of the PMOS transistors PM12 through PM14. The drains of the NMOS transistors NM12 through NM14 are connected with ground, respectively. NMOS transistors NM15 through NM17 have drains respectively connected with rated current power sources IREF1, IREF2 and IREF3 and sources respectively connected with the ground.ABhouette Gates and drains of the NMOS transistors NM15 through NM17 are connected together and are respectively connected with the gates of the NMOS transistors NM12 through NM14. Inverters INV12 through INV14 are for inverting the output signals from the respectively connected drains of the PMOS transistors PM12 through PM14 and drains of the NMOS transistors NM12 through NM14. A coding logic circuit 3 receives the output signals from the inverters INV12 through INV14 and inverts the received signals into 2-bit digital signals.

The operation of the related art sensing circuit reading a multiple level cell will now be described. First, the bit line selection circuit 2 connects the memory array including a plurality of memory cells and the drain of a predetermined cell, which is to be read, with the bit line.

In the sensing mode, the bit line regulation circuit 1 constantly maintains the drain voltage of the cell. The PMOS load transistor PM11 and three current comparison type sensor amplifiers connect the bit line current and a current mirror. In addition, the coding logic circuit 3 converts the signal from the sense amplifier into 2-bit data.

The drain of the selected cell and the cell current ICELL of the bit line have four level values and are compared with three reference currents IREF1, IREF2 and IREF3. The cell current ICELL and the reference currents IREF1, IREF2 and IREF3 are compared by the sense amplifier. As a result of the comparison, if the cell current ICELL is larger than the reference currents IREF1, IREF2 and IREF3, the output signal values SA0, SA1 and SA2 from the sense amplifier become "0", respectively.

For example, assume that four current level values of the cell current ICELL are IL1, IL2, IL3 and IL4, and the data D1 and D0 are two bit output data are defined as (0,0), (0,1), (1,0), (1,1). In this case, if the cell current ICELL is identical with the first current level value IL1, the output values SA0, SA1 and SA2 from the sense amplifier all become "0". When coding the value, the output data D1 and D0 all become "0". Multiple threshold voltages and reference currents are shown in FIG. 2.

The current ICELL flowing in the bit line in the sensing mode becomes one of four current level values IL1, IL2, IL3 and IL4. Therefore, in the sensing mode, the current is consumed on the bit line in which the cell current Icel flows and consumed on up to three sensing lines.

As described above, the related out sensing circuit for a multiple level cell has various disadvantages. If the applied word line voltage is large, a high current flows on the bit line so that the consumed current increases. If the window of the threshold voltage programmed by the multiple level cell is wide, the voltage of the word line is higher than the maximum threshold voltage in the sensing mode, and the excess current flows in the cell having a lower threshold voltage.

If the voltage consumption is limited in one chip, the number of cells that are concurrently sensed should be a corresponding predetermined number. In addition, as the number of multiple levels stored in one cell is increased, the number of the sense amplifiers is increased. Therefore, the size of the circuit is increased. Accordingly, since a portable system needs a low power nonvolatile memory, the related art circuit is not applicable to the portable system.

The above references are incorporated by reference herein where appropriate for appropriate teachings of additional or alternative details, features and/or technical background.

SUMMARY OF THE INVENTION

An object of the present invention is provided a circuit and method for sensing a memory cell having a plurality of threshold voltages that substantially overcome one or more problems encountered in the background art.

Another object of the present invention to provide a circuit and method for sensing a memory cell having a plurality of threshold voltages that implement a low power operation.

Another object of the present invention to provide a circuit and method for sensing a memory cell having a plurality of threshold voltages that implement a voltage sensing operation.

Another object of the present invention to provide a circuit and method for sensing a memory cell having a plurality of threshold voltages that reduce a size of a multiple level memory cell by reducing a size of the sense circuit.

Another object of the present invention to provide a circuit and method for sensing a memory cell of a plurality of multiple level memory cells that reduces the amount of current flowing in a selected cell when sensing the selected memory cell by having a single sense amplifier.

To achieve at least the above objects in a whole or in parts, there is provided a circuit for sensing a memory cell having a plurality of threshold voltages according to the present invention that includes a switch for applying or blocking a current to/from a memory cell in accordance with a switching control signal inputted into a bit line coupled with a selected memory cell, a current comparison unit for comparing current on the bit line and one reference current and outputting a result of the comparison, a memory for storing a result of the comparison performed by the current comparison unit, and a counter register circuit that corresponds with the number of multiple levels of the memory cell.

To further achieve the above objects in a whole or in parts there is provided a method for sensing a memory cell having a plurality of threshold voltages according to the present invention that includes a first step setting a plurality of voltages to recognize each threshold voltage of memory cell of a memory array, a second step initializing a memory device and a counter, a third step applying a lowest level voltage among the voltages set in the first step to the word line, a fourth step sensing a memory cell, a fifth step storing a result of the sensing operation of the fourth step into the memory device, a sixth step counting the counter using the value stored in the memory device in the fifth step as a control signal, and a seventh step applying the voltage having a predetermined level next to the lowest level of the first step to the word line.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 5 is a flow chart illustrating a method for sensing a memory cell having a plurality of threshold voltages according to a second preferred embodiment of the present invention.

DETAILED DESCRIPTION OF PREFERRED EMBODIMENTS

Figure 1:
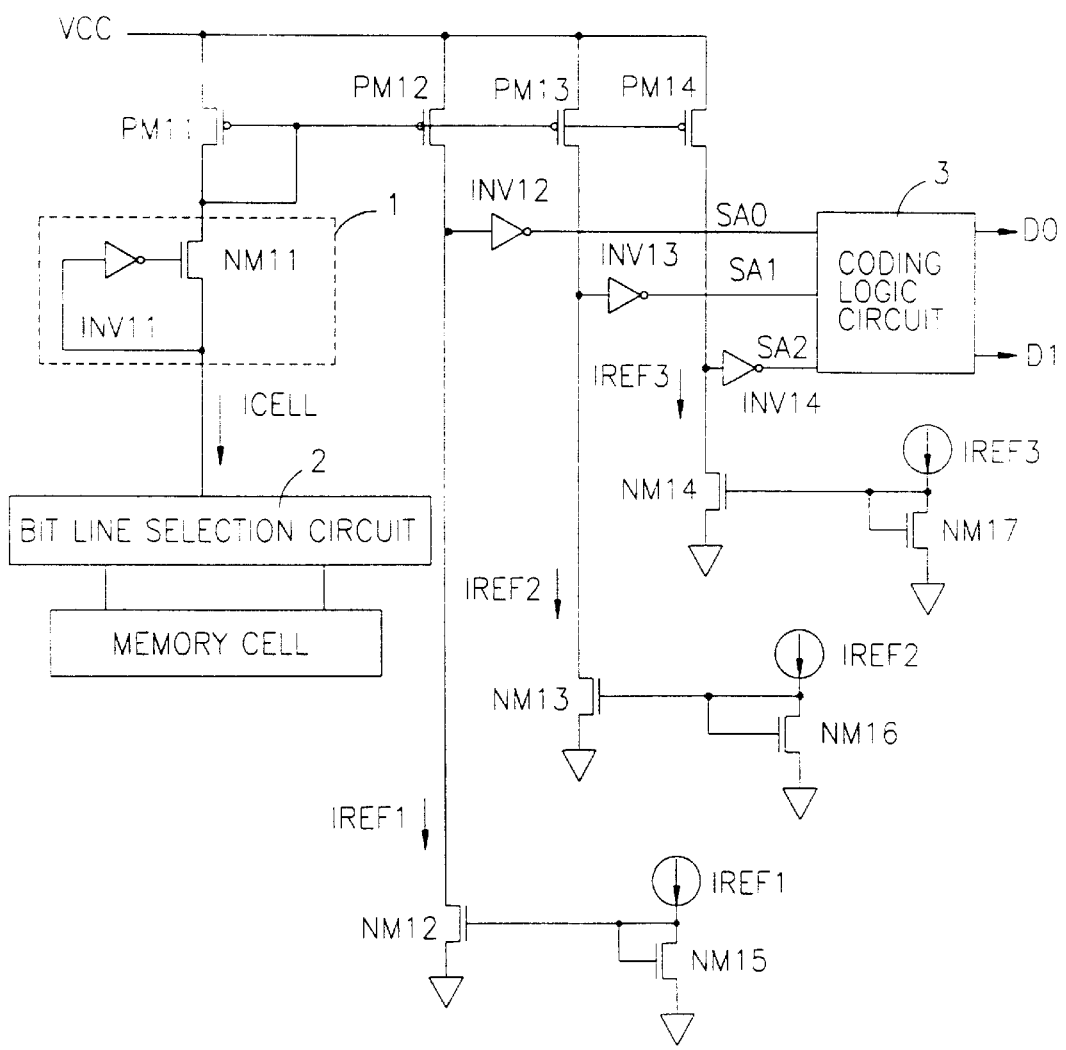
FIG. 1 is a circuit diagram illustrating a related art circuit for sensing a memory cell having a plurality of threshold voltages.
Figure 2:
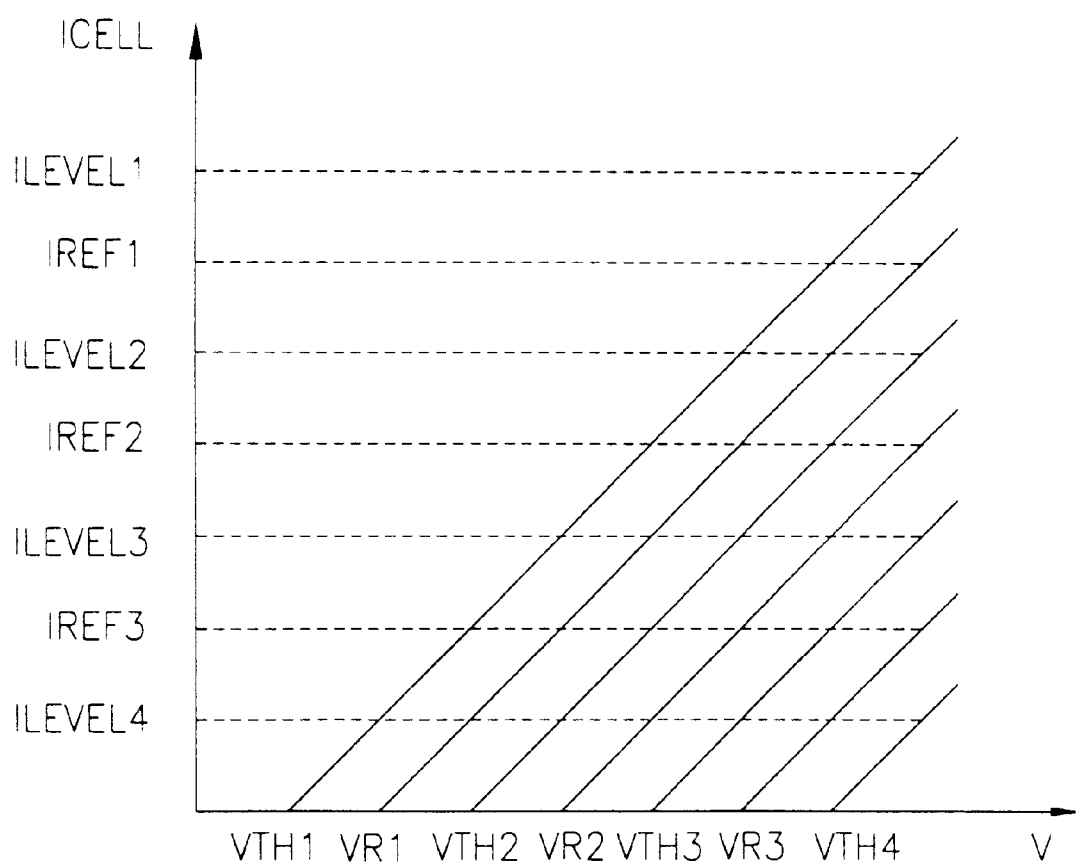
FIG. 2 is a graph illustrating an interrelationship between a voltage and a threshold voltage applied to a word line of the circuit of FIG. 1.
Figure 3:
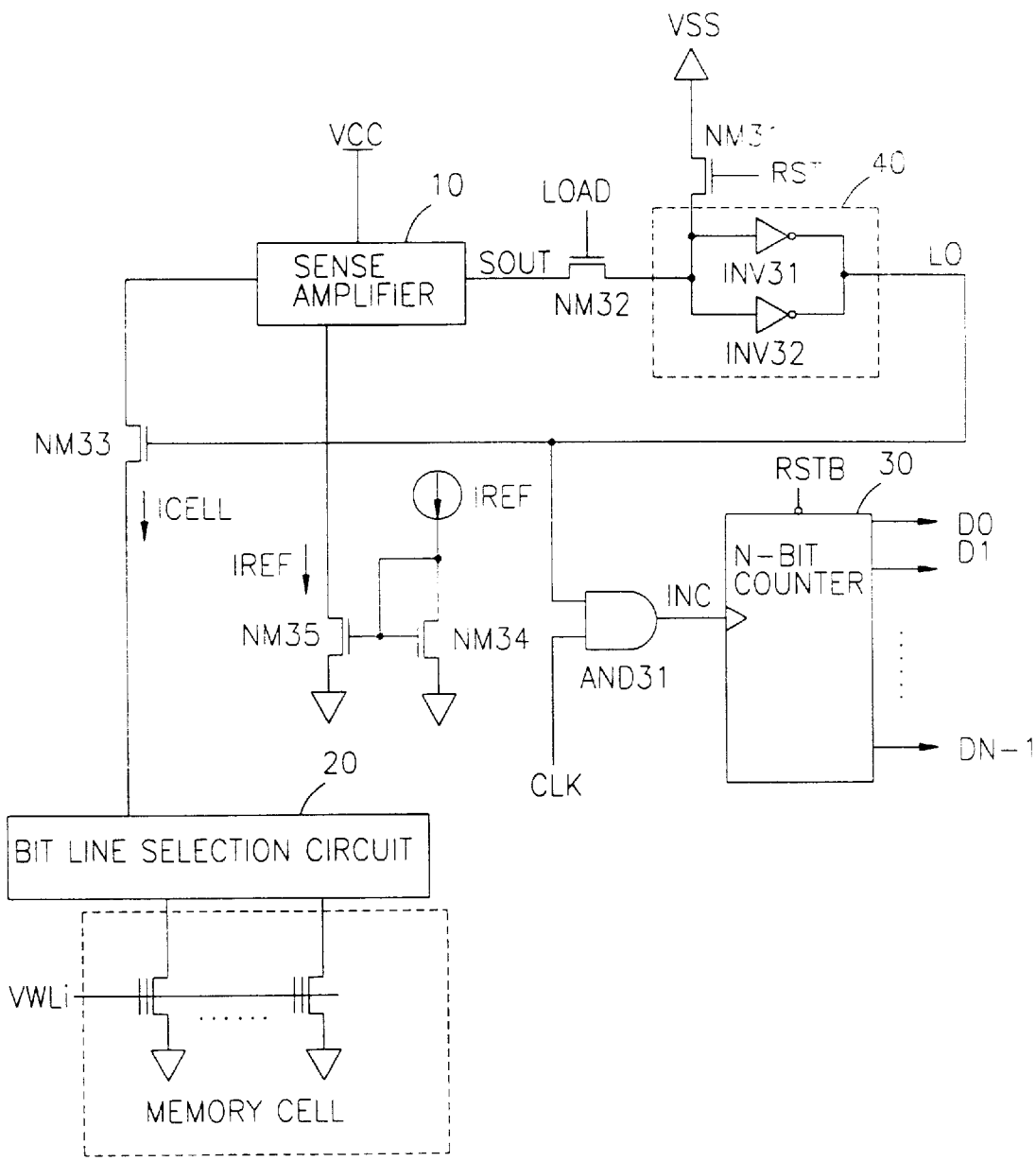
FIG. 3 is a circuit diagram illustrating a circuit for sensing a memory cell having a plurality of threshold voltages according to a first preferred embodiment of the present invention.

As shown in FIG. 3, a first preferred embodiment of a circuit for sensing a multiple level cell in which one cell stores N-bit data includes a sense amplifier 10 for receiving a power voltage VCC and comparing a cell current ICELL and a reference current IREF. An NMOS transistor NM31 has a drain coupled with ground VSS and a gate that receives a reset signal RST. A data latch unit 40 includes two inverters INV31 and INV32 that have their outputs and inputs coupled together. An NMOS transistor NM32 is coupled between the sense amplifier 10 and the data latch unit 40 and has a gate coupled with a load. An NMOS transistor NM33 serves as a switch coupling the bit line and the sense amplifier 10.

An NMOS transistor NM34 has a source coupled with a rated current power IREF, a drain coupled with the ground VSS and its gate. An NMOS transistor NM35 has a gate coupled with the gate of the NMOS transistor NM34, a source coupled with the ground VSS, and a drain coupled with the sense amplifier 10. An AND-gate AND31 has a first input terminal coupled with the data latch unit 10 and the gate of the NMOS transistor NM33 and a second input terminal receives an external clock signal CLK, and an N-bit counter 30 receives an output signal INC from the AND-gate AND. The N-bit counter 30 can be increase-counted once by receiving the output signal INC and is reset by the inverted reset signal RSTB.

Operations of the first preferred embodiment of the circuit for sensing the multiple level cell according to the present invention will now be described. Assuming that the first preferred embodiment of the sensing circuit detects four level signals and outputs 2-bit data, the N-bit counter 30 becomes a 2-bit counter. In addition, the channel of the memory cell is assumed to be N-type.

A type of the sense amplifier 10 can be varied. Thus, the sense amplifier 10 may be a current type sense amplifier or a voltage type sense amplifier that, for example, can compare the levels of two input currents.

The latch unit 40 is initialized by the reset signal RST so that an output signal LO from the latch unit 40 becomes "1". The sense amplifier 10 compares the cell current ICELL and the reference current IREF and outputs a result SOUT of the comparison. The comparison result is assumed to be "1" if the cell current ICELL is larger than the reference current IREF and the comparison result assumed to be "0" if the cell current ICELL is smaller than the reference current IREF. However, the present invention is not intended to be so limited.

Figure 4:
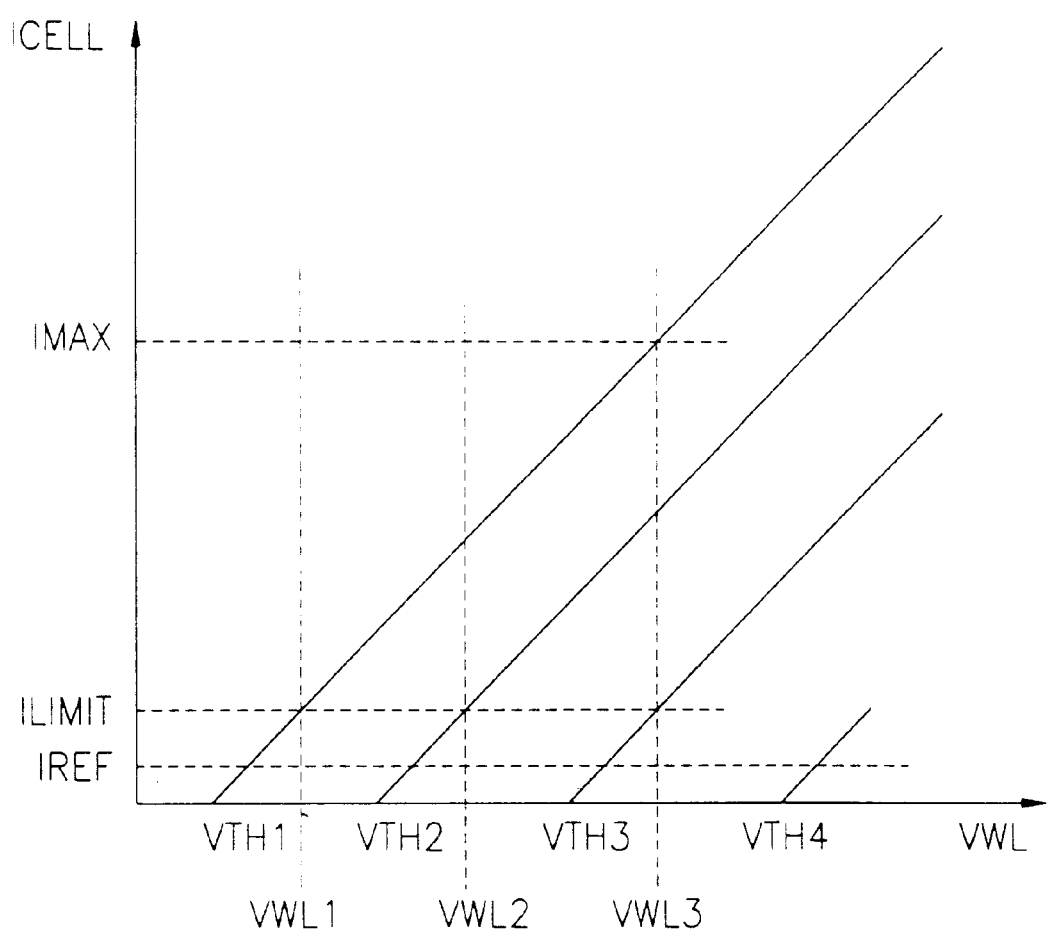
FIG. 4 is a graph illustrating an interrelationship between a voltage and a cell current applied to a word line of the circuit of FIG. 3.

In the sensing circuit, three word line voltages are needed for sensing a cell that stores four level voltages. As shown in FIG. 4, word line voltages VWL1, VWL2, and VWL3 are provided between four threshold voltages VTH1, VTH2, VTH3 and VTH4.

A multiple level sensing operation according to a second preferred embodiment will now be described. As shown in FIG. 5, the process begins and continues to step 51.

In step 51, for the multiple level sensing operation, multiple word line voltages, for example, three word line voltages VWL1, VWL2 and VWL3 are determined, and then control continues to step 52. In step 52, the sensing circuit is initialized. After the initializing step is finished, the output signal LO from the latch unit is "1" and the 2-bit counter 30 is a state of "00".

From step 52, control continues to step 53. In step 53, an i-th word line voltage, which is preferably the lowest (e.g., first) word line voltage VWL1 is applied to the word line, and control continues to step 54. The sensing amplifier 10 is operated in step 54. As an example, assume that the selected memory cell has a second threshold voltage VTH2 state as shown in FIG. 4.

Since the first word line voltage VWL1 applied to the word line is lower than the threshold voltage VTH2 of the cell, the current does not flow in the selected cell. If the reference current IREF inputted into the sense amplifier 10 has a value larger than "0", the output signal SOUT from the sense amplifier 10 preferably becomes "0". Similarly, the output signal SOUT from the sense amplifier 10 preferably becomes "1" if the cell current ICELL is larger than the reference current IREF.

From the step 54, control continues to step 55. In step 55, a determination is made whether the signal LO equals "1". If the signal LO does not equal "1", control jumps to step 57, otherwise control continues to step 56. In step 56, the counter is operated, and control continues to step 57.

Continuing the above example, since the output signal SOUT from the sense amplifier 10 is "0", the latch unit 40 maintains the initial state, and the output signal LO from the latch unit 40 maintains "1" in step 55. When the sensing operation is finished, the clock pulse CLK is applied once. When one rising edge signal of the clock is applied, the output value from the 2-bit counter 30 is changed from "00" to "01".

In step 57, i is increased by 1 and control continues to step 58. In step 58, a determination is made whether all possible word line voltages have been applied. If i is equal to N, where N is the number of word line voltages the process ends. Otherwise, control returns to step 53.

Continuing the above example, the second word line voltage VWL2 is increased because control returns to step 53 where the second word line voltage value applied, and in step 57 the sensing operation is performed. At this time, as shown in FIG. 4, the current of the second word line voltage VWL2 is a limit current ILIMIT, and the value thereof is larger than the reference current IREF. Therefore, the output signal from the sense amplifier 10 becomes "1", and the result signal LO from the latch unit 40 becomes "0".

After the sensing operation is finished, the clock pulse signal CLK is applied again in step 56. However, since the result signal LO from the latch unit 40 is "0", the control signal INC is transmitted to the two bit counter 30 becomes "0", and the two bit counter 30 does not operate. Therefore, the previous data of "01" is maintained.

Similarly, an increased word line voltage VWL3 is subsequently applied to the word line, and then the sensing operation is performed. At this time, since the result signal LO from the latch unit 40 is "0", the current does not flow between the selected cell and the bit line. The third clock pulse signal CLK is applied. At this time, since the result signal LO from the latch unit 40 is "0", the two bit counter 30 maintains a previous data of "01".

When the third clock pulse signal CLK is applied, the sensing operation is finished. Therefore, the result value of "01" from the two bit counter 30 becomes a data corresponding to the threshold voltage of the memory cell.

As described above, the preferred embodiments of the sensing circuit and method according to the present invention have various advantages. Since the cell current ICELL is larger than the reference current IREF (the threshold current may be used), and the limit current ILIMIT does not flow, the circuit is operated as a low current. Thus, a low power and voltage sensing operation of the nonvolatile memory can be implemented. Accordingly, the preferred embodiments can be used in a low power and voltage system such as a mobile communication terminal or a hand-held PC. In addition, since one sense amplifier in the preferred embodiments is used for reading the N-bit data stored in the cell, a size of the circuit is decreased, and the size of the multiple level memory chip can be decreased.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit for sensing a memory cell having a plurality of threshold voltages, comprising:
    a selection unit that controls a current flow between a selected memory cell and a bit line coupled with the selected memory cell based on a switching control signal;
    a single current comparison circuit that compares respective sizes of a current flowing on the bit line and a reference current and outputs a result of the comparison; and
    a storage circuit that stores the result of the comparison performed by the current comparison circuit, wherein the switching control signal that controls the selection unit is a data value from the storage circuit.

2. The circuit of claim 1, wherein the reference current compared by the current comparison circuit is varied between a plurality of prescribed levels equal to one less than the plurality of threshold voltages.

3. The circuit of claim 1, wherein said current comparison circuit is a sense amplifier.

4. The circuit of claim 3, wherein the sense amplifier is one of a current type sense amplifier and a voltage type sense amplifier.

5. The circuit of claim 1, further comprising a counter register circuit that counts a value corresponding with a number of multiple levels of the memory cell.

6. The circuit of claim 5, wherein the counter register circuit counts responsive to data stored in the storage circuit used as a counting data signal.

7. The circuit of claim 1, wherein the selection unit is a switch.

8. The circuit of claim 1, wherein the selection unit is blocked and the size of the current flowing on the bit line is limited when a data value stored in the storage circuit becomes an opposite value compared to an initial value.

9. A method for sensing a memory cell having a plurality of threshold voltages, comprising the steps of:
    applying a first voltage level among a plurality of prescribed voltage levels to a word line;
    sensing a selected memory cell;
    storing a result of the sensing operation of the selected cell into a storage device; and
    performing the applying through storing steps for each of remaining voltage levels of the prescribed voltage levels, wherein in the sensing a selected memory cell step, current flows on a bit line when the storage device maintains an initial state, and the current does not flow on the bit line when the storage device does not maintain an initial state.

10. The method of claim 9, wherein the sensing step uses a single sense amplifier.

11. The method of claim 9, wherein the storing a result of the sensing operation step comprises:
    storing the result of the selected cell into the storage device, wherein the storage device is a latch; and
    counting a counter based on the result stored in the latch as a control signal, wherein the counter has a range corresponding with the plurality of threshold voltages.

12. The method of claim 9, further comprising:
    setting the plurality of prescribed voltage levels to identify each threshold voltage of the selected memory cell; and
    initializing the storage device and a counter.

13. The method of claim 9, wherein a counter is one of incremented and decremented.

14. The method of claim 9, wherein a counter contains a value corresponding to a two-bit value stored in the selected memory cell.

15. A method for sensing a memory cell having a plurality of threshold voltages, comprising the steps of:
    a first step for setting a plurality of prescribed voltages to identify each threshold voltage of a selected memory cell of a memory array; and a second step for initializing a memory device and a counter;

a third step for applying a lowest level voltage among the prescribed voltages to the word line;

a fourth step for sensing a memory cell;

a fifth step for storing a result of the sensing operation of the selected cell into the memory device;

a sixth step for counting the counter using the result stored in the memory device in the fifth step as a control signal, wherein in the sixth step, the counting operation is performed when the memory device maintains an initial state, and the counting operation is not performed when the memory device does not maintain an initial state; and a seventh step for applying the next lowest level voltage of the prescribed voltages to the word line.

16. The method of claim 15, wherein the second through seventh steps are performed with respect to each of the remaining prescribed voltages using a single sense amplifier.

17. A method for sensing a memory cell having a plurality of threshold voltages, comprising:

(a) setting a plurality of prescribed voltages to identify each threshold voltage of a selected memory cell of a memory array;

(b) for initializing a latch and a counter;

(c) applying a first level voltage among the prescribed voltages to the word line;

(d) sensing the selected memory cell;

(e) storing a result of the sensing operation of the selected cell into the latch;

(f) counting the counter using the result stored in the latch as a control signal; and (g) repeating steps (d)–(f) with next level voltage of the prescribed voltages if the latch maintains the initial value of the initializing step and not repeating steps (d)–(f) if the latch does not maintain the initial value.

18. The method of claim 17, wherein the counter stops counting responsive to the control signal changing from the initialized value to a second value according to the result of the sensing operation, wherein the counter stores a value corresponding to data of the selected cell.

* * * * *